(12) United States Patent
K et al.

(10) Patent No.: US 10,408,883 B2
(45) Date of Patent: Sep. 10, 2019

(54) METHOD AND APPARATUS FOR MONITORING A DC POWER SOURCE

(71) Applicant: GM GLOBAL TECHNOLOGY OPERATIONS LLC, Detroit, MI (US)

(72) Inventors: Raghunathan K, Troy, MI (US); Brian J. Koch, Berkley, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 97 days.

(21) Appl. No.: 15/475,741

(22) Filed: Mar. 31, 2017

(65) Prior Publication Data

US 2018/0284195 A1 Oct. 4, 2018

(51) Int. Cl.
*G01R 31/36* (2019.01)
*H01M 10/44* (2006.01)
*H01M 10/48* (2006.01)
*G01R 31/367* (2019.01)
*G01R 31/392* (2019.01)
*H01M 10/052* (2010.01)
*G01R 31/3835* (2019.01)

(52) U.S. Cl.
CPC ....... *G01R 31/367* (2019.01); *G01R 31/3835* (2019.01); *G01R 31/392* (2019.01); *H01M 10/052* (2013.01); *H01M 10/44* (2013.01); *H01M 10/48* (2013.01); *H01M 10/446* (2013.01)

(58) Field of Classification Search
CPC ........... G01R 31/3651; G01R 31/3679; H01M 10/446; H01M 10/48
See application file for complete search history.

(56) References Cited

U.S. PATENT DOCUMENTS

2015/0134283 A1* 5/2015 Ogura ................ G01R 31/3648
702/63
2015/0321572 A1* 11/2015 Koch ..................... G01R 31/44
701/22

* cited by examiner

*Primary Examiner* — Regis J Betsch
*Assistant Examiner* — Jeremy A Delozier
(74) *Attorney, Agent, or Firm* — Quinn IP Law

(57) ABSTRACT

Evaluation of a DC power source can include communication with a voltmeter that is arranged to monitor electrical potential across positive and negative electrodes. The method includes determining a full-cell open-circuit voltage ("OCV"), an associated positive half-cell OCV, and an associated negative half-cell OCV at a start-of-life point of the DC power source. A lithium balance model is executed to determine a plurality of beginning states associated with an electrode alignment of the DC power source. An in-use state for the full-cell OCV is determined. An optimization routine is executed employing the lithium balance model to determine in-use states associated with the electrode alignment of the DC power source based upon the in-use state for the full-cell OCV and the beginning states associated with electrode alignment. A negative-to-positive ("N/P") ratio is determined based upon the in-use states, and battery life is evaluated based upon the N/P ratio.

19 Claims, 5 Drawing Sheets

METHOD AND APPARATUS FOR MONITORING A DC POWER SOURCE

INTRODUCTION

Some DC power sources may have a tendency to undergo changes in performance in-use.

SUMMARY

A DC power source including a positive electrode and a negative electrode is described. A method for evaluating the DC power source is embodied in a controller in communication with a voltmeter that is arranged to monitor electrical potential across the positive and negative electrodes. The method includes determining a full-cell open-circuit voltage ("OCV"), an associated positive half-cell OCV, and an associated negative half-cell OCV at a start-of-life point of the DC power source. A lithium balance model is executed to determine a plurality of beginning states associated with an electrode alignment of the DC power source based upon the full-cell OCV, the positive half-cell OCV and the negative half-cell OCV at the start-of-life point of the DC power source. An in-use state for the full-cell OCV is determined. An optimization routine is executed employing the lithium balance model to determine in-use states associated with the electrode alignment of the DC power source based upon the in-use state for the full-cell OCV and the beginning states associated with electrode alignment. A negative-to-positive ("N/P") ratio is determined based upon the in-use states associated with the electrode alignment of the DC power source, and battery life is evaluated based upon the N/P ratio.

An aspect of the disclosure includes determining the plurality of beginning states associated with electrode alignment, which includes determining an initial positive stoichiometric coefficient, a final positive stoichiometric coefficient, an initial negative stoichiometric coefficient and a final negative stoichiometric coefficient associated with a fractional lithium occupancy at the start-of-life point of the DC power source.

Another aspect of the disclosure includes determining the in-use states associated with the in-use electrode alignment, which includes determining in-use values for the initial positive stoichiometric coefficient, the final positive stoichiometric coefficient, the initial negative stoichiometric coefficient and the final negative stoichiometric coefficient associated with the fractional lithium occupancy of the DC power source in-use.

Another aspect of the disclosure includes determining the N/P ratio based upon the in-use values for the initial positive stoichiometric coefficient, the final positive stoichiometric coefficient, the initial negative stoichiometric coefficient and the final negative stoichiometric coefficient.

Another aspect of the disclosure includes determining data for the full-cell OCV and the half-cell OCV for each of the positive and negative electrodes employing a low charge-rate charge/discharge profile.

Another aspect of the disclosure includes the lithium balance model having a form associated with the equation:

$$U_{cell}(SOC) = U_{pos}(y_f - SOC(y_f - y_i)) - U_{neg}(x_f + SOC(x_i - x_f))$$

wherein:
SOC is the present state of charge,
Ucell(SOC) is the full-cell OCV at the SOC,
Upos is the positive half-cell OCV at the SOC,
Uneg is the negative half-cell OCV at the SOC,
yi is the initial positive stoichiometric coefficient,
yf is the final positive stoichiometric coefficient,
xi is the initial negative stoichiometric coefficient, and
xf is the final negative stoichiometric coefficient.

Another aspect of the disclosure includes executing the optimization routine employing the lithium balance model to determine in-use states associated with the electrode alignment of the DC power source, which includes executing a least-squares minimization method to determine values for yi, yf, xi, xf based upon the full-cell OCV, the positive half-cell OCV, and the negative half-cell OCV for the DC power source.

Another aspect of the disclosure includes evaluating battery life based upon the N/P ratio, which includes evaluating a remaining service life of the DC power source based upon the N/P ratio.

Another aspect of the disclosure includes determining a positive SOC capacity based upon the in-use values for the initial positive stoichiometric coefficient and the final positive stoichiometric coefficient, and determining a negative SOC capacity based upon the in-use values for the initial negative stoichiometric coefficient and the final negative stoichiometric coefficient.

Another aspect of the disclosure includes evaluating a battery state estimator based upon the positive and negative SOC capacities.

Another aspect of the disclosure includes evaluating a battery state estimator based upon a ratio of the negative and positive SOC capacities.

Another aspect of the disclosure includes evaluating the battery state estimator based upon a ratio of the negative and positive SOC capacities, which includes indicating an end-of-service life of the DC power source when the ratio of the negative and positive SOC capacities is less than one.

Another aspect of the disclosure includes determining the full-cell OCV, the associated positive half-cell OCV, and the associated negative half-cell OCV for each of a plurality of SOC states between a minimum SOC and a maximum SOC at a start-of-life point of the DC power source.

Another aspect of the disclosure includes the DC power source being a lithium-ion battery.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some or all of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein.

Figure 1:
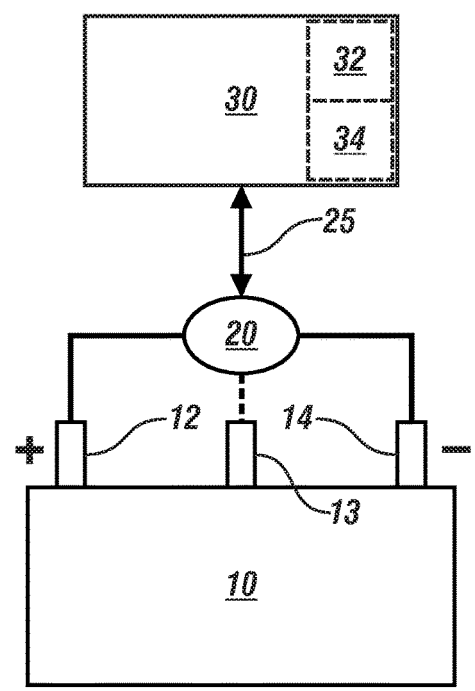
FIG. 1 schematically illustrates a rechargeable DC power source having positive and negative electrodes, and monitored by a voltmeter that is in communication with a controller, in accordance with the disclosure.

Referring to the drawings, wherein like reference numerals correspond to like or similar components throughout the several Figures, FIG. 1, consistent with embodiments disclosed herein, illustrates a rechargeable DC power source 10 having a positive terminal 12 and a negative terminal 14. In one embodiment, the DC power source 10 is configured as a lithium-ion battery. A voltmeter 20 is disposed to monitor electrical potential between the positive terminal 12 and the negative terminal 14. The voltmeter 20 is in communication with a controller 30, which includes executable code 32.

The term "controller" and related terms such as control module, module, control, control unit, processor and similar terms refer to one or various combinations of Application Specific Integrated Circuit(s) (ASIC), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. Communication between controllers, and communication between controllers, actuators and/or sensors may be accomplished using a direct wired point-to-point link, a networked communication bus link, a wireless link or another suitable communication link, and is indicated by line 25. Communication includes exchanging data signals in suitable form, including, for example, electrical signals via a conductive medium, electromagnetic signals via air, optical signals via optical waveguides, and the like. The data signals may include discrete, analog or digitized analog signals representing inputs from sensors, actuator commands, and communication between controllers. The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

The term 'model' refers to a processor-based or processor-executable code and associated calibration that simulates a physical existence of a device or a physical process. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine. The terms "calibration", "calibrate", and related terms refer to a result or a process that compares an actual or standard measurement associated with a device with a perceived or observed measurement or a commanded position. A calibration as described herein can be reduced to a storable parametric table, a plurality of executable equations or another suitable form. The term "parameter" refers to a measurable quantity that represents a physical property of a device or other element that is discernible using one or more sensors and/or a physical model. A parameter can have a discrete value, e.g., either "1" or "0", or can be infinitely variable in value.

A process for monitoring and evaluating an embodiment of the DC power source 10 is described, and includes determining and employing a full-cell open-circuit voltage (OCV) and half-cell OCVs from charge-discharge profiles. The full-cell OCV and half-cell OCVs are advantageously employed in estimating cell stoichiometry for the DC power source 10. This includes monitoring of individual electrode capacities and an N/P ratio at the beginning of life and in-use, including characterizing an OCV shift in-use in an onboard battery state estimation (BSE). A cell balance of the DC power source 10 can be determined, which can be employed to predict cell performance. Such results can support root-cause analysis efforts to identify cell fault mechanisms, such as occurrence of lithium plating or a loss of electrode capacity. The process can provide baseline data for cell porous electrode models that can be used for predicting cell performance and early detection of occurrence of a cell fault in the DC power source 10.

The process for monitoring and evaluating an embodiment of the DC power source 10 provides a cell diagnostic tool that determines the alignment of positive and negative electrodes 12, 14 in the DC power source 10. This includes determining start of life half-cell OCVs for the positive and negative electrodes 12, 14, which are preferably derived from low-rate charge-discharge profiles. Examples of low-rate charge-discharge profiles for determining the start of life half-cell OCVs for the positive and negative electrodes are shown graphically with reference to FIGS. 3 and 4, respectively. The process also includes execution and analysis employing parameters associated with a lithium balance model, which can be employed to determine electrode alignment (stoichiometry) from the full-cell OCV data and to estimate individual electrode capacities and a negative-to-positive ("N/P") ratio. The electrode alignment is described in context of stoichiometry, which indicates a quantitative relationship between products and reactants in a chemical reaction. As employed herein, the stoichiometric term is an accounting of how much lithium is transferred from the anode or positive electrode 12 to the cathode or negative electrode 14 during discharge, and is preferably expressed relative to the total lithium storage capacity of each electrode. An example of parameters related to the lithium balance model is described with reference to FIG. 2 and EQ. 1.

Figure 2:
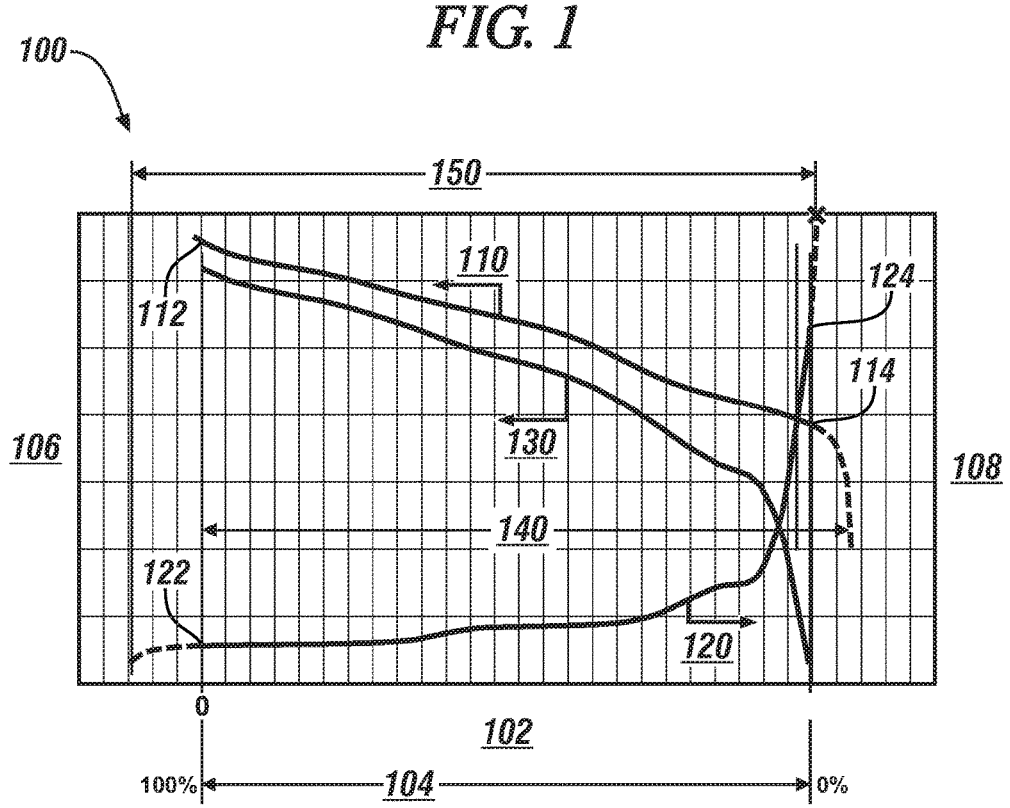
FIG. 2 graphically shows parametric data associated with operation of a DC power source, including a full-cell OCV, a positive half-cell OCV and a negative half-cell OCV, all shown in relation to a cell capacity and a state of charge (SOC), in accordance with the disclosure.

FIG. 2 graphically shows data 100 that is associated with an embodiment of the DC power source 10 that is described with reference to FIG. 1, including parameters that can be employed in a lithium balance model to determine electrode alignment (stoichiometry) from the full-cell OCV data and to estimate individual electrode capacities and a negative-to-positive ("N/P") ratio. The lithium balance model can be expressed as follows:

$$U_{cell}(SOC) = U_{pos}(y_f - SOC \cdot (y_f - y_i)) - U_{neg}(x_i + SOC \cdot (x_i - x_f)) \quad [1]$$

wherein:
SOC is the state of charge of the DC power source 10,
Ucell(SOC) is the full-cell OCV at the SOC,
Upos is the positive half-cell OCV at the SOC,
Uneg is the negative half-cell OCV at the SOC,
yi is the initial positive stoichiometric coefficient,
yf is the final positive stoichiometric coefficient,
xi is the initial negative stoichiometric coefficient, and
xf is the final negative stoichiometric coefficient The term "initial" refers to the state when the cell is fully charged, and "final" refers to the state when the cell is fully discharged.

The horizontal axis of FIG. 2 shows a cell power capacity (Ah) 102 and SOC (%) 104, wherein the SOC ranges between a maximum value (100%) and a minimum value (0%). Plotted results include the full-cell OCV 130, a positive half-cell OCV 110 and a negative half-cell OCV 120. The left vertical axis 106 shows magnitude of the full-cell OCV and the positive half-cell OCV, and the right vertical axis 108 shows magnitude of the negative half-cell OCV, wherein the zero-point scale and order of magnitude of the left vertical axis differs from the zero-point scale and order of magnitude of the right vertical axis for purposes of illustrating the concepts described herein.

The positive half-cell OCV 110, i.e., Upos, represents the potential difference between the positive electrode, e.g., positive electrode 12, and a reference electrode 13, and Uneg is the difference between the negative and the same reference electrode 13. The reference electrode in this case is lithium metal, which has a fixed and unchanging potential that is arbitrarily described as 0.0V in this system. A reference electrode 13 may be fabricated from materials other than lithium metal, albeit with different but fixed and unchanging potentials and may be substituted to the same effect. Methods and devices for measuring the positive and negative half-cell OCVs are understood. The full-cell OCV, i.e., Ucell, represents an arithmetic difference between the positive half-cell OCV and the negative half-cell OCV, which can be determined at a given magnitude of SOC.

The positive half-cell OCV is indicated by line 110 in FIG. 2. Parameters associated with the positive half-cell OCV 110 include the initial positive stoichiometric coefficient yi, which is indicated by point 112, and the final positive stoichiometric coefficient yf, which is indicated by point 114. The initial positive stoichiometric coefficient yi represents an initial fractional lithium occupancy of the positive electrode at a cell SOC=100%, and the final positive stoichiometric coefficient yf represents a final fractional lithium occupancy of the positive electrode at a cell SOC=0%. The negative half-cell OCV is indicated by line 120 in FIG. 2. The initial negative stoichiometric coefficient xi 122 represents an initial fractional lithium occupancy of the negative electrode at SOC=100%, and the final negative stoichiometric coefficient xf 124 represents a final fractional lithium occupancy of the negative electrode at SOC=0%. The initial positive stoichiometric coefficient yi 112, the final positive stoichiometric coefficient yf 114, the initial negative stoichiometric coefficient xi 122 and the final negative stoichiometric coefficient xf 124 relate to electrode alignment of the DC power source 10. A range for a positive capacity $Q_{pos}^T$ 140 and a range for a negative capacity $Q_{neg}^T$ 150 are also indicated.

The positive capacity $Q_{pos}^T$ 140 is determined based upon the cell power capacity (capacity) in relation to the initial positive stoichiometric coefficient yi and the final positive stoichiometric coefficient yf, and can be calculated as follows:

$$Q_{pos}^T = \frac{capacity}{(y_f - y_i)} \quad [2]$$

The negative capacity $Q_{neg}^T$ 150 is determined based upon the cell power capacity (capacity) in relation to the initial negative stoichiometric coefficient xi and the final negative stoichiometric coefficient xf, and can be calculated as follows:

$$Q_{neg}^T = \frac{capacity}{(x_i - x_f)} \quad [3]$$

Parametric states for the positive half-cell OCV at the SOC, i.e., Upos, and the negative half-cell OCV at the SOC, i.e., Uneg, can be determined at a start-of-life point of the DC power source 10.

The OCV of the DC power source 10 has a tendency to shift in-use. In-use states of the initial positive stoichiometric coefficient yi, the final positive stoichiometric coefficient yf, the initial negative stoichiometric coefficient xi and the final negative stoichiometric coefficient xf can be employed to monitor the OCV shift, all relate to electrode alignment of the DC power source 10. The positive capacity $Q_{pos}^T$ 140 and the negative capacity $Q_{neg}^T$ 150 can be employed to characterize the OCV shift.

Figure 5:
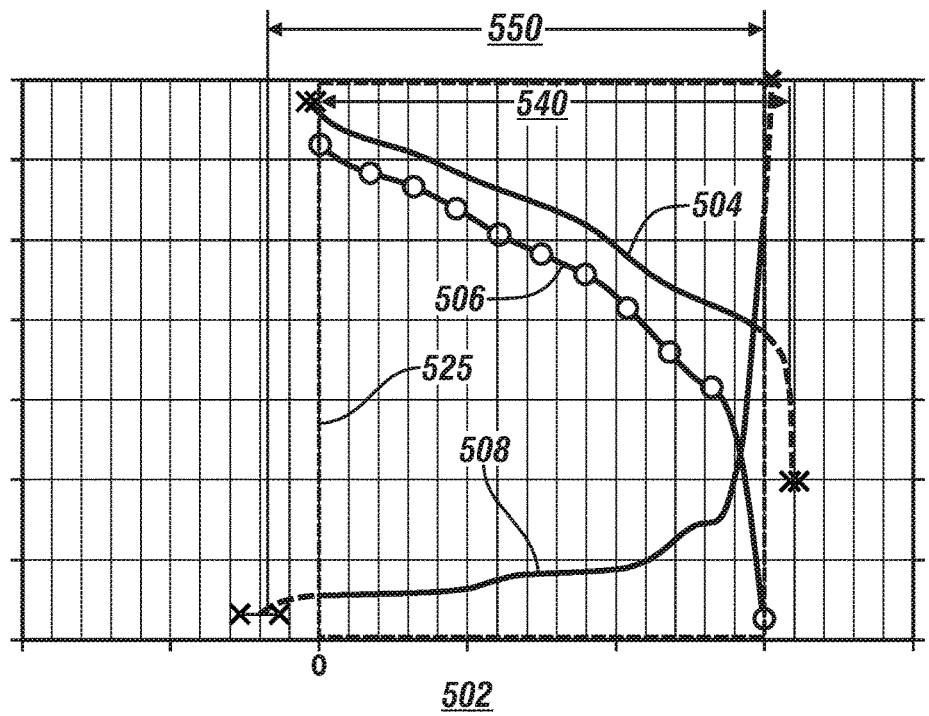
FIG. 5 graphically shows start-of-life data associated a DC power source, in accordance with the disclosure.

FIG. 5 graphically shows data that is associated with an embodiment of the DC power source 10 that is described with reference to FIG. 1 at a start-of-life point. The horizontal axis shows a cell power capacity (Ah) 502. Plotted results include the full-cell OCV 504, a positive half-cell OCV 506 and a negative half-cell OCV 508. The left vertical axis shows magnitude of the full-cell OCV and the positive half-cell OCV, and the right vertical axis shows magnitude of the negative half-cell OCV, wherein the zero-point scale and order of magnitude of the left vertical axis differs from the zero-point scale and order of magnitude of the right vertical axis for purposes of illustrating the concepts described herein. A positive capacity $Q_{pos}^T$ 540 can be determined by determining the relevant states and employing EQ. 2, and a negative capacity $Q_{neg}^T$ 550 can be determined by determining the relevant states and employing EQ. 3. Overlap of the positive capacity $Q_{pos}^T$ 540 and the negative capacity $Q_{neg}^T$ 550 can be employed to define a cell window, with unused portions of the full-cell OCV 504, the positive half-cell OCV 506 and the negative half-cell OCV 508 being indicated by dashed lines.

Figure 6:
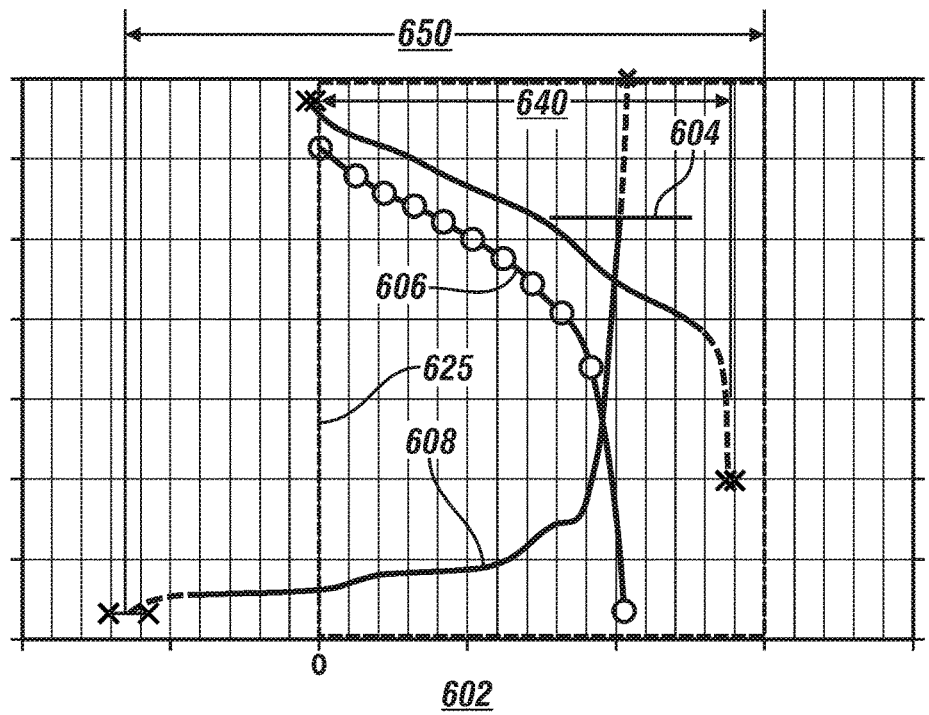
FIG. 6 graphically shows in-use data associated with a DC power source, in accordance with the disclosure.

FIG. 6 graphically shows data that is associated with an embodiment of the DC power source 10 that is described with reference to FIG. 1 when it is in-use, including repetitive cycles of charging and discharging. The horizontal axis shows a cell capacity (Ah) 602. Plotted results include the full-cell OCV 604, a positive half-cell OCV 606 and a negative half-cell OCV 608. The left vertical axis shows magnitude of the full-cell OCV and the positive half-cell OCV, and the right vertical axis shows magnitude of the negative half-cell OCV, wherein the zero-point scale and order of magnitude of the left vertical axis differs from the zero-point scale and order of magnitude of the right vertical axis for purposes of illustrating the concepts described herein. A positive capacity $Q_{p\_as}^T$ 640 can be determined by determining the relevant states and employing EQ. 2, and a negative capacity $Q_{neg}^T$ 650 can be determined by determining the relevant states and employing EQ. 3. Overlap of the positive capacity $Q_{pos}^T$ 640 and the negative capacity $Q_{neg}^T$ 650 can be employed to define a cell window, with unused portions of the full-cell OCV 604, the positive half-cell OCV 606 and the negative half-cell OCV 608 being indicated by dashed lines.

A comparison between the cell window 525 associated with start-of-life of the DC power source 10 of FIG. 5 and the cell window 625 associated with in-use performance of the DC power source 10 of FIG. 6 can be employed to characterize the OCV shift and improve predictability of parameters related to battery state. The indicated overlap of the positive capacity $Q_{pos}^T$ 540 and the negative capacity $Q_{neg}^T$ 550 can be employed to determine electrode alignment from the full-cell OCV data, which may be an indication of a stoichiometric point.

A ratio, referred to herein as negative/positive or "N/P" can be determined as follows, based upon the initial positive stoichiometric coefficient yi, the final positive stoichiometric coefficient yf, the initial negative stoichiometric coefficient xi and the final negative stoichiometric coefficient xf.

$$N/P = \frac{(y_f - y_i)}{(x_i - x_f)} \quad [4]$$

The N/P ratio is an indicator of the cell capacity (Ah) of the DC power source 10. This relationship is shown with reference to FIG. 9.

Figure 3:
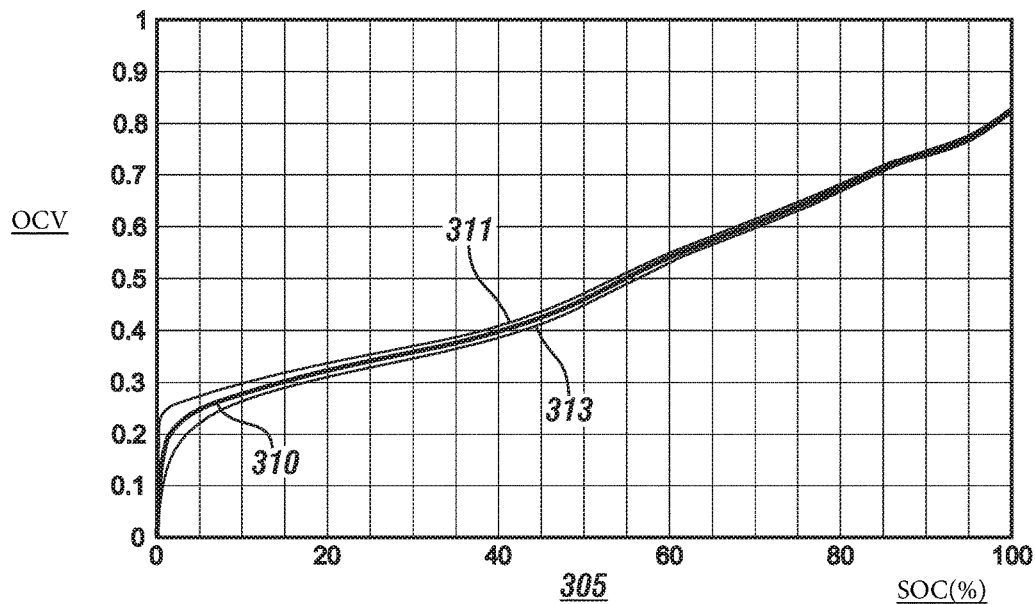
FIG. 3 graphically shows an example of a characteristic curve for the positive half-cell OCV, wherein the positive half-cell OCV is shown in relation to SOC, in accordance with the disclosure.
Figure 4:
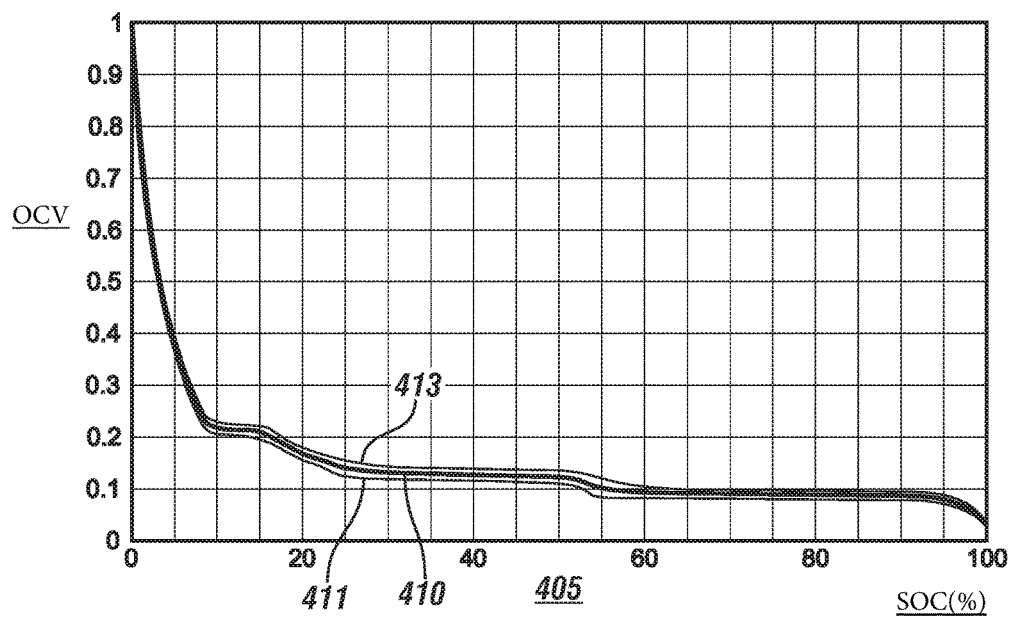
FIG. 4 graphically shows an example of a characteristic curve for the negative half-cell OCV, wherein the negative half-cell OCV is shown in relation to SOC, in accordance with the disclosure.

The lithium balance model described with reference to EQ. 1 and FIG. 2 can be advantageously employed to provide an in-use evaluation of an embodiment of the DC power source 10 described with reference to FIG. 1. This evaluation can include characterizing the DC power source 10 by monitoring states to determine a positive half-cell OCV, a negative half-cell OCV, and a full-cell OCV for each of a plurality of SOC states between a minimum SOC and a maximum SOC at a start-of-life point of the DC power source 10. FIG. 3 graphically shows an example of a characteristic curve 310 for the positive half-cell OCV, wherein the positive half-cell OCV 310 is shown in relation to SOC 305. The characteristic curve 310 is preferably determined employing low charge/discharge rates, wherein the characteristic curve during charging is indicated by line 313 and the characteristic curve during discharging is indicated by line 311. FIG. 4 graphically shows an example of a characteristic curve 410 for the negative half-cell OCV, wherein the negative half-cell OCV is shown in relation to SOC 405, which is plotted on the horizontal axis. The characteristic curve 410 is preferably determined employing low charge/discharge rates, wherein the characteristic curve during charging is indicated by line 411 and the characteristic curve during discharging is indicated by line 413.

The lithium balance model, including EQ. 2, can be transformed to executable code including an algorithm and calibrated coefficients, which are stored in the memory storage device of the controller 30. The lithium balance model can be executed to determine a plurality of states, including the initial positive stoichiometric coefficient yi, the final positive stoichiometric coefficient yf, the initial negative stoichiometric coefficient xi, and the final negative stoichiometric coefficient xf, all of which associated with a fractional lithium occupancy at the start-of-life point of the DC power source. These values can be stored in the memory device 34 of the controller 30.

During in-use operation of a system that employs the DC power source 10, an in-use state for the full-cell OCV can be determined by direct monitoring or another suitable measurement system.

The controller 30 can execute an optimization routine employing the lithium balance model of EQ. 2 and the in-use state for the full-cell OCV to determine in-use states for the initial positive stoichiometric coefficient yi, the final positive stoichiometric coefficient yf, the initial negative stoichiometric coefficient xi, and the final negative stoichiometric coefficient xf. The optimization routine can be a suitable routine, e.g., a least-squares minimization method that employs the in-use state for the full-cell OCV, i.e., Ucell (SOC). The optimization routine employs the in-use state for the full-cell OCV and the values for the positive half-cell OCV in relation to the SOC and the negative half-cell OCV in relation to the SOC to determine the in-use states.

Figure 7:
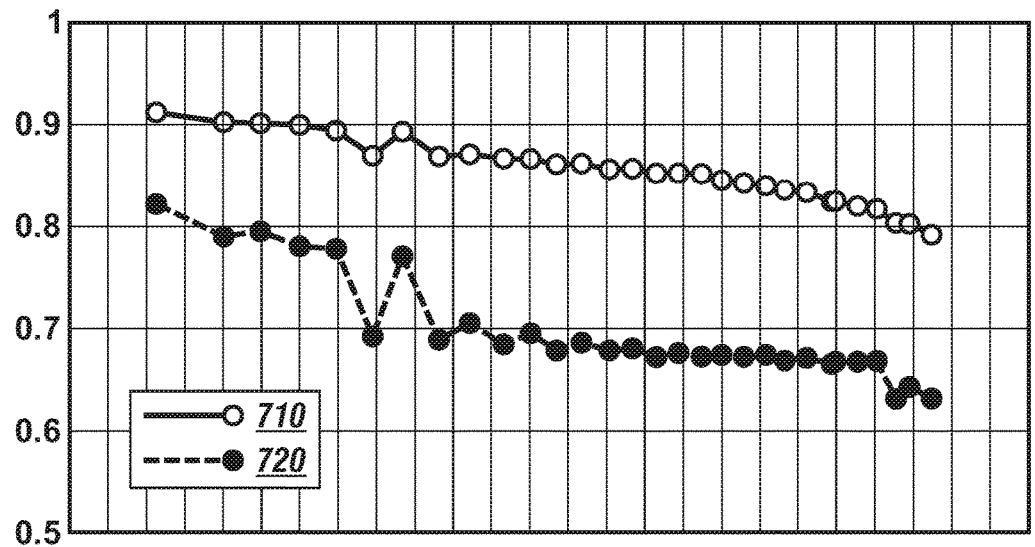
FIG. 7 graphically show states a final positive stoichiometric coefficient and initial negative stoichiometric coefficient in relation to a cell capacity (Ah) that is indicative of battery life, in accordance with the disclosure.
Figure 8:
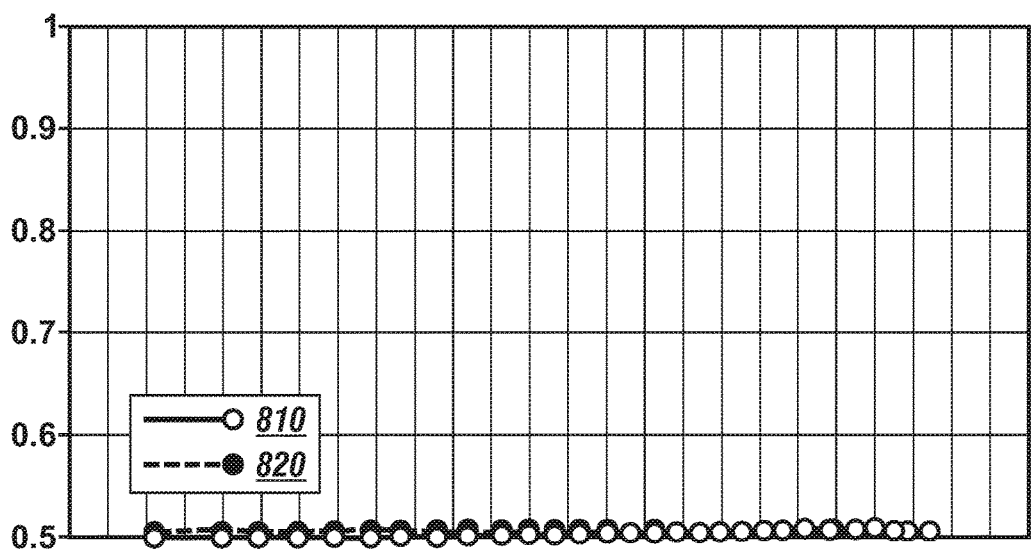
FIG. 8 graphically show states for an initial positive stoichiometric coefficient and a final negative stoichiometric coefficient in relation to a cell capacity (Ah) that is indicative of battery life, in accordance with the disclosure.

The optimization routine can be simplified so that it finds in-use values for the final positive stoichiometric coefficient yf and the initial negative stoichiometric coefficient xi. FIG. 7 graphically shows states for the final positive stoichiometric coefficient yf 710 and the initial negative stoichiometric coefficient xi 720 in relation to the cell capacity (Ah), which is indicated on the x-axis 705 and decreases from left to right. The cell capacity (Ah) indicates a maximum amount of electrical energy that can be stored on the DC power source 10. As indicated, the final positive stoichiometric coefficient yf 710 and the initial negative stoichiometric coefficient xi 720 both decrease with a decrease in the cell capacity (Ah). FIG. 8 graphically shows states for the initial positive stoichiometric coefficient yi 810 and the final negative stoichiometric coefficient xf 820 in relation to the cell power capacity (Ah), which is indicated on the x-axis 805 and decreases from left to right. As indicated, the initial positive stoichiometric coefficient yi 810 and the final negative stoichiometric coefficient xf 820 remain unchanged with a decrease in the cell capacity (Ah). As such, the initial positive stoichiometric coefficient yi 810 and the final negative stoichiometric coefficient xf 820 can be pre-calibrated and stored in the memory device 34, and do not have to be determined in-use.

The in-use states for the initial positive stoichiometric coefficient yi, the final positive stoichiometric coefficient yf, the initial negative stoichiometric coefficient xi, and the final negative stoichiometric coefficient xf are associated with the electrode alignment of the DC power source 10, and can be employed to calculate the negative-to-positive ("N/P") ratio, e.g., as is described with reference to EQ. 4. The N/P ratio can be employed to evaluate the DC power source 10, including evaluating its service life.

Figure 9:
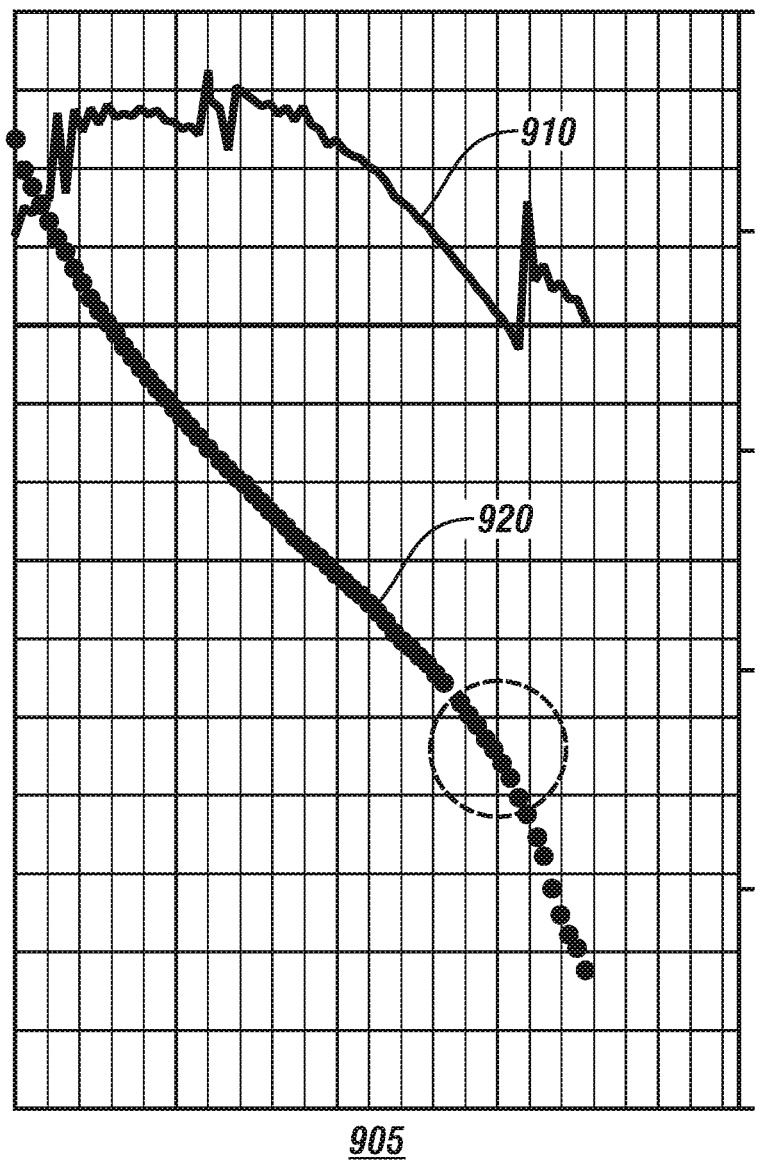
FIG. 9 graphically shows data associated with in-use service of a DC power source, including a negative/positive (N/P) ratio and cell capacity (Ah), which are plotted in relation to service life, in accordance with the disclosure.

FIG. 9 graphically shows data associated with in-use service of an embodiment of the DC power source 10 described with reference to FIG. 1, and include an N/P ratio 910 and cell capacity (Ah) 920 that is plotted in relation to service life 905 (e.g., in units of days). The scale for the N/P ratio is indicated on the left vertical axis and the scale for the cell capacity (Ah) is indicated on the right vertical axis. The N/P ratio of 1.0 is indicated by a horizontal line. The cell capacity 920 is shown to decrease with an increase in the service life. The N/P ratio is greater than 1.0 for a long period of time, and then begins to decrease with a decrease in the cell capacity 920. Critically, when the cell capacity 920 is about 50% of its original capacity, the N/P ratio 910 decreases to a level that is less than 1.0. This relationship between the cell capacity 920 and the N/P ratio 910 has been shown to be a repeatable characteristic of embodiments of the DC power source 10, and thus can be employed in an on-board routine to monitor the DC power source 10 non-intrusively.

The concepts described herein illustrate an example method of a computing system that either stores instructions thereon or receives instructions from a remote controller that is in communication with the system. The concepts may be implemented through a computer algorithm, machine executable code, non-transitory computer-readable medium, or software instructions programmed into a suitable programmable logic device(s), such as the one or more modules, a server in communication therewith, a mobile device communicating with the computing system and/or server, or a combination thereof.

Embodiments in accordance with the present disclosure may be embodied as an apparatus, method, or computer program product. Accordingly, the present disclosure may take the form of an entirely hardware embodiment, an entirely software embodiment (including firmware, resident software, micro-code, etc.), or an embodiment combining software and hardware aspects that may be referred to herein as a "module" or "system." Furthermore, the present disclosure may take the form of a computer program product embodied in a tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. Computer program code for carrying out operations of the present disclosure may be written in a combination of one or more programming languages.

Embodiments may also be implemented in cloud computing environments, and as such as may be remotely located. In this description and the following claims, "cloud computing" may be defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction, and then scaled accordingly. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

The flowchart and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which includes one or more executable instructions for implementing the specified logical function(s). It will also be noted that each block of the block diagrams and/or flowchart illustrations, and combinations of blocks in the block diagrams and/or flowchart illustrations, may be implemented by single-purpose hardware-based systems that perform the specified functions or acts, or combinations of single-purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction sets that implement the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

The invention claimed is:

1. A method for evaluating a DC power source including a positive electrode and a negative electrode, the method comprising:

determining a full-cell open-circuit voltage (OCV), a positive half-cell OCV associated with the positive electrode at a start-of-life point of the DC power source, and a negative half-cell OCV associated with the negative electrode at the start-of-life point of the DC power source wherein the positive half-cell OCV is determined at the start-of-life point of the DC power source employing a reference electrode and the positive electrode, and wherein the negative half-cell OCV is determined at the start-of-life point of the DC power source employing the reference electrode and the negative electrode;

executing, via a controller, a lithium balance model to determine a plurality of beginning states associated with an electrode alignment of the DC power source based upon the full-cell OCV, the positive half-cell OCV and the negative half-cell OCV at the start-of-life point of the DC power source;

determining an in-use state for the full-cell OCV;

executing, via the controller, an optimization routine employing the lithium balance model to determine in-use states associated with the electrode alignment of the DC power source based upon the in-use state for the full-cell OCV and the beginning states associated with electrode alignment;

determining a negative-to-positive ("N/P") ratio based upon the in-use states associated with the electrode alignment of the DC power source;

determining, in-use, a remaining service life of the DC power source based upon the N/P ratio; and determining an end-of-service life of the DC power source when the N/P ratio is less than 1.0.

2. The method of claim 1, wherein determining the plurality of beginning states associated with electrode alignment includes determining an initial positive stoichiometric coefficient, a final positive stoichiometric coefficient, an initial negative stoichiometric coefficient and a final negative stoichiometric coefficient associated with a fractional lithium occupancy at the start-of-life point of the DC power source.

3. The method of claim 1, wherein determining the in-use states associated with the in-use electrode alignment includes determining in-use values for an initial positive stoichiometric coefficient, a final positive stoichiometric coefficient, an initial negative stoichiometric coefficient and a final negative stoichiometric coefficient associated with a fractional lithium occupancy of the DC power source in-use.

4. The method of claim 3, comprising determining the N/P ratio based upon the in-use values for the initial positive stoichiometric coefficient, the final positive stoichiometric coefficient, the initial negative stoichiometric coefficient and the final negative stoichiometric coefficient.

5. The method of claim 1, wherein data for determining the full-cell OCV and the half-cell OCV for each of the positive and negative electrodes is determined employing a low charge-rate charge/discharge profile.

6. The method of claim 1, wherein the lithium balance model comprises the following equation:

$$U_{cell}(SOC) = U_{pos}(y_f - SOC(y_f - y_i)) - U_{neg}(x_f + SOC(x_i - x_f))$$

wherein;
SOC is the present state of charge,
Ucell(SOC) is the full-cell OCV at the SOC,
Upos is the positive half-cell OCV associated with the positive electrode at the SOC,
Uneg is the negative half-cell OCV associated with the negative electrode at the SOC,
yi is the initial positive stoichiometric coefficient,
yf is the final positive stoichiometric coefficient,
xi is the initial negative stoichiometric coefficient, and
xf is the final negative stoichiometric coefficient.

7. The method of claim 6, wherein executing the optimization routine employing the lithium balance model to determine in-use states associated with the electrode alignment of the DC power source comprises executing a least-squares minimization method to determine values for yi, yf, xi, xf based upon the full-cell OCV, the positive half-cell OCV, and the negative half-cell OCV for the DC power source.

8. The method of claim 1, further comprising:

determining a positive SOC capacity based upon the in-use values for the initial positive stoichiometric coefficient and the final positive stoichiometric coefficient; and determining a negative SOC capacity based upon the in-use values for the initial negative stoichiometric coefficient and the final negative stoichiometric coefficient.

9. The method of claim 8, comprising evaluating a battery state estimator based upon the positive and negative SOC capacities.

10. The method of claim 9, comprising evaluating a battery state estimator based upon a ratio of the negative and positive SOC capacities.

11. The method of claim 9, wherein evaluating the battery state estimator based upon a ratio of the negative and positive SOC capacities comprises indicating an end-of-service life of the DC power source when the ratio of the negative and positive SOC capacities is less than one.

12. The method of claim 1, comprising determining the full-cell OCV, the associated positive half-cell OCV, and the associated negative half-cell OCV for each of a plurality of SOC states between a minimum SOC and a maximum SOC at a start-of-life point of the DC power source.

13. The method of claim 1, wherein the DC power source comprises a lithium-ion battery.

14. A controller in communication with a voltmeter disposed to monitor a DC power source, the controller including an instruction set, the instruction set executable to:

determine a full-cell open-circuit voltage (OCV), a positive half-cell OCV associated with a positive electrode at a start-of-life point of the DC power source, and a negative half-cell OCV associated with the negative electrode at the start-of-life point of the DC power source, wherein the positive half-cell OCV is determined at the start-of-life point of the DC power source employing a reference electrode and the positive electrode, and wherein the negative half-cell OCV is determined at the start-of-life point of the DC power source employing the reference electrode and the negative electrode;

execute a lithium balance model to determine a plurality of beginning states associated with an electrode alignment of the DC power source based upon the full-cell OCV, the positive half-cell OCV and the negative half-cell OCV at the start-of-life point of the DC power source;

determine an in-use state for the full-cell OCV;

execute an optimization routine employing the lithium balance model to determine in-use states associated with the electrode alignment of the DC power source based upon the in-use state for the full-cell OCV and the beginning states associated with electrode alignment;

determine a negative-to-positive ("N/P") ratio based upon the in-use states associated with the electrode alignment of the DC power source;

determine an end-of-service life of the DC power source when the N/P ratio is less than 1; and communicate the end-of-service life of the DC power source to a second controller.

15. The controller of claim 14, wherein the lithium balance model comprises the following equation:

$$U_{cell}(SOC) = U_{pos}(y_f - SOC(y_f - y_i)) - U_{neg}(x_f + SOC(x_i - x_f))$$

wherein:
SOC is the present state of charge,
Ucell(SOC) is the full-cell OCV at the SOC,
Upos is the positive half-cell OCV at the SOC,
Uneg is the negative half-cell OCV at the SOC,
yi is the initial positive stoichiometric coefficient,
yf is the final positive stoichiometric coefficient,
xi is the initial negative stoichiometric coefficient, and
xf is the final negative stoichiometric coefficient.

16. The controller of claim 15, wherein the optimization routine employs the lithium balance model to determine in-use states associated with the electrode alignment of the DC power source comprises executing a least-squares minimization method to determine values for yi, yf, xi, xf based upon the full-cell OCV, the positive half-cell OCV, and the negative half-cell OCV for the DC power source.

17. The controller of claim 14, wherein the instruction set executable to evaluate battery life based upon the N/P ratio comprises the instruction set executable to evaluate a remaining service life of the DC power source based upon the N/P ratio.

18. The controller of claim 14, wherein the instruction set is further executable to:
  determine a positive SOC capacity based upon the in-use values for the initial positive stoichiometric coefficient and the final positive stoichiometric coefficient; and
  determine a negative SOC capacity based upon the in-use values for the initial negative stoichiometric coefficient and the final negative stoichiometric coefficient.

19. The controller of claim 18, comprising the instruction set executable to evaluate a battery state estimator based upon the positive and negative SOC capacities.

* * * * *